United States Patent [19]
Kim et al.

[11] Patent Number: 5,932,009
[45] Date of Patent: Aug. 3, 1999

[54] WAFER SPINNER HAVING A HEAT CONTROLLER FOR FABRICATING A SEMICONDUCTOR DEVICE

[75] Inventors: Jong-kwan Kim, Suwon; Sun-jib Choi, Hwasong-gun, both of Rep. of Korea

[73] Assignee: Samsung Electronics Co., Ltd., Suwon, Rep. of Korea

[21] Appl. No.: 08/969,662

[22] Filed: Nov. 13, 1997

[30] Foreign Application Priority Data

Nov. 28, 1996 [KR] Rep. of Korea ............... 96-59056

[51] Int. Cl.$^6$ .................................................. B05C 13/00
[52] U.S. Cl. .................. 118/52; 118/58; 118/59; 118/500; 392/416; 392/418; 219/390; 219/405; 219/411
[58] Field of Search .................... 118/52, 58, 59, 118/500, 725; 427/240; 392/418, 416; 219/405, 411, 390

[56] References Cited

U.S. PATENT DOCUMENTS

| | | | |
|---|---|---|---|
| 3,369,989 | 2/1968 | Kay et al. ........................... | 118/59 |
| 5,315,092 | 5/1994 | Takahashi et al. ................. | 392/418 |
| 5,580,607 | 12/1996 | Takekuma et al. ................ | 118/59 |
| 5,624,590 | 4/1997 | Fiory ..................................... | 219/390 |
| 5,790,750 | 8/1998 | Anderson ............................. | 219/411 |
| 5,809,211 | 9/1998 | Anderson et al. ................... | 392/416 |
| 5,817,178 | 10/1998 | Mita et al. ........................... | 118/59 |
| 5,830,277 | 11/1998 | Johnsgard et al. ................. | 219/405 |

*Primary Examiner*—Laura Edwards
*Attorney, Agent, or Firm*—Jones Volentine, L.L.P.

[57] ABSTRACT

A spinner which distributes a photoresist on a wafer in a semiconductor device fabrication apparatus includes a rotation-plate vacuum chuck which holds a wafer, a driving motor which rotates the chuck and a temperature controller assembly. The temperature controller assembly maintains a temperature distribution along the chuck within a predetermined temperature-distribution range. The temperature controller assembly includes a non-contact thermometer, a non-contact variable heater, and a heat regulator. By controlling the temperature in the chuck, a photoresist layer can be coated on a wafer with more uniform thickness than if the temperature were not controlled.

11 Claims, 2 Drawing Sheets

WAFER SPINNER HAVING A HEAT CONTROLLER FOR FABRICATING A SEMICONDUCTOR DEVICE

BACKGROUND OF THE INVENTION

1. Field of the Invention

The present invention relates to a wafer spinner for fabricating a semiconductor device, and more particularly, to a wafer spinner which coats the entire surface of a wafer with a nearly uniform layer of photoresist by controlling the temperature of the wafer.

2. Discussion of the Related Art

Photolithography is used to form a precise predetermined pattern on a specific material layer as part of a semiconductor device fabricating process. The pattern must be precise because the device has very minute structures. Photolithography processes use photochemical reactions of a photoresist to establish the pattern on the layer and to remove the photoresist after the pattern has been formed. Photolithography apparatus include a stepper for performing photolithography and a spinner for coating a photoresist on a wafer.

In the general photolithography process, after the photoresist is coated on the wafer, a pattern is projected onto the photoresist using light, thus exposing a portion of the photoresist. During the development process, either the exposed or unexposed portion of the photoresist is removed, depending on the specific application. Thereafter, a specific material is deposited and the remaining photoresist is removed, leaving a patterned layer.

More specifically, the photolithography process starts by coating a wafer with a photoresist. The coating operation is usually performed using a wafer spinner to rotate the wafer and spread the photoresist along the surface of the wafer. The wafer is oriented horizontally on the spinner's rotation plate comprising a vacuum chuck for holding the wafer in place by vacuum action. The spinner is then rotated and a predetermined amount of photoresist is supplied from above the center of the wafer. The photoresist spreads over the entire surface of the wafer due to the centrifugal force of the rotating wafer.

It is important for the spinner to coat the wafer with a predetermined, uniform thickness of photoresist over the entire surface of the wafer. If the photoresist is too thin, some of the unexposed region may be removed while removing the exposed portion during the development process. If the photoresist is too thick, a portion of the pattern is not exposed sufficiently, leaving a photoresist pattern wider than the predetermined pattern after the development process. This produces a pattern wider or narrower than a designed line width, or produces a pattern with a missing element. As a result, the semiconductor device may malfunction. Moreover, if the photoresist is not coated on the wafer uniformly, it is difficult to set the standards for the following processes. Even if the standards are set optimally, the greater deviation in the structure widths will lead to more chips on the wafer that deviate farther from the standards, which results in greater numbers of defects and reduced yields.

FIG. 1 is a schematic cross-sectional view of a conventional spinner. A rotation-plate vacuum chuck 13 is connected to a driving motor 11 through a rotation shaft 12 at the center of the spinner. A wafer 10 is loaded on the rotation chuck 13. Only a portion of the wafer 10 near the center of the wafer 10 is placed on the rotation chuck 13. A bowl (upper cup) 14 is placed over the wafer, and a lower cup 15 is placed under the wafer. The cups 14 and 15 prevent cleaning water or photoresist from splashing out of the apparatus during processing.

An inner cup 16 is placed under the rotation chuck 13 and surrounds it, to prevent the photoresist from damaging the driving motor 11 placed under the rotation chuck. The surplus cleaning water and photoresist are guided by the inner cup 16, bowl 14 and lower cup 15, to drain through a drain outlet 17 placed below the lower cup 15.

FIG. 2 is a cross-sectional view showing a wafer 20 on which a photoresist 21 is coated using the conventional spinner. The photoresist supplied to the center of wafer 20 is a sol-state (colloidal) substance containing a volatile solvent. The photoresist spreads on the wafer due to the centrifugal force generated by rotating the wafer with the spinner, and the centrifugal force drives the liquid to the edge of the wafer. Since the photoresist has surface tension, some photoresist may accumulate on the edge of the wafer. After a period of time, the volatile solvent evaporates and a semi-solid photoresist layer 21 is formed on wafer 20. FIG. 2 shows that the photoresist layer 21 near the edge of the wafer is thicker than in other areas. The distance from the center A of the wafer 20 to the location B on the wafer 20 where the semi-solid photoresist begins to thicken due to surface tension is called the flat-zone radius. The area of the wafer within the flat-zone radius is the flat zone.

Because of the thicker semi-solid photoresist layer near the edge, it is difficult to produce uniform chips in both the flat zone and the outer wafer edge beyond the flat zone radius B of the same wafer 20. This variation leads to an increase in the probability of creating poor quality chips. This problem becomes more serious as the semiconductor devices become more highly integrated, and as the diameter of the wafer increases.

FIG. 3 is a cross-sectional view showing a wafer 30 on which a photoresist layer 31 is coated using the conventional spinner while its rotation shaft is heated by the motor. As in the case above, the sol-state photoresist is supplied at the center A of the wafer. The fluidity or viscosity of the photoresist layer 31 depends inversely on the temperature. In other words, the fluidity of the liquid photoresist decreases with higher temperature, and the thickness of the layer 31 coated increases, because the solvent contained in the liquid photoresist evaporates more quickly at the higher temperature. For example, for a 1000 Å thick layer of photoresist that is deposited, about 100 Å of additional semi-solid photoresist is created and coated on the wafer 30 for each 1° C. of temperature difference.

As wafers 30 are sequentially loaded onto the spinner and the spinner continues to operate to coat photoresist on the loaded wafers 30, the driving motor 11 (in FIG. 1) continues to generate heat that causes its temperature to rise. This heat is transmitted to the rotation chuck 13 and wafers 10 through the rotation shaft 12. The transmitted heat increases the temperature of the liquid photoresist deposited near the center A of the wafer 30, compared to the photoresist that spreads to the outer portions of the wafer 30, which in turn increases the thickness of the photoresist 31 in the center A. Here, the temperature is increased from a range of about 21 to 22° C. (ambient temperature) during the initial operation of the spinner, to a range of about 25 to 26° C. later in the process. Thus, the thickness variation of the photoresist layer 31 from center-to-edge is about 400 Å as a result of the 4° C. increase. This variation exceeds the designed quality control standard of ±50 Å for the photoresist layer, and frequently causes poor quality chips.

FIG. 4 is a cross-sectional view of a conventional spinner having a motor flange 41 for cooling its driving motor 11. Cooling water flows in the direction of the arrows through the motor flange 41 located on driving motor 11 to thereby remove the heat generated in the driving motor 11. Though a portion of heat is transmitted to the rotation chuck 13 through the rotation shaft 12, the temperature increase is mitigated somewhat by the cooling water. Accordingly, referring to FIG. 3, it is possible to prevent the thickness of the photoresist layer 3 coated near the center A of wafer 30 from increasing as much. However, even in this case, the photoresist layer at the outer regions of the wafer is thicker than the portion of the wafer between the center and edge of the wafer. Again, such a non-uniform photoresist layer results in greater numbers of wafer defects and reduced yields.

SUMMARY OF THE INVENTION

Accordingly, the present invention is directed to a spinner for fabricating a semiconductor device that substantially overcomes one or more of the problems due to limitations and disadvantages of the related art.

To achieve these and other advantages, the present invention provides a wafer spinner which distributes photoresist on a wafer in a semiconductor device fabrication apparatus, the spinner comprising a rotation-plate vacuum chuck for holding a wafer; a driving motor which rotates the chuck; and a temperature controller assembly for maintaining a temperature distribution of the chuck within a predetermined temperature-distribution range.

In a preferred embodiment the predetermined temperature-distribution range is between an original temperature of the photoresist supplied to the wafer and a temperature about 3° C. greater than the original temperature.

In addition, the temperature controller assembly comprises a variable heat source for heating the chuck on at least one heating location on the chuck spaced from a center of the chuck; a temperature sensor, for sensing at least one localized temperature of the chuck at a sensing location on the chuck spaced from the center of the chuck, and for producing a signal proportional to the localized temperature; and a heat regulator for receiving the signal and controlling the variable heat source to maintain the localized temperature within a predetermined localized temperature range.

BRIEF DESCRIPTION OF THE DRAWINGS

The features and advantages of the present invention will be described with reference to the attached drawings in which.

DETAILED DESCRIPTION OF THE INVENTION

Reference will now be made in detail to the preferred embodiments of the present invention, examples of which are illustrated in the accompanying drawings.

Figure 5:
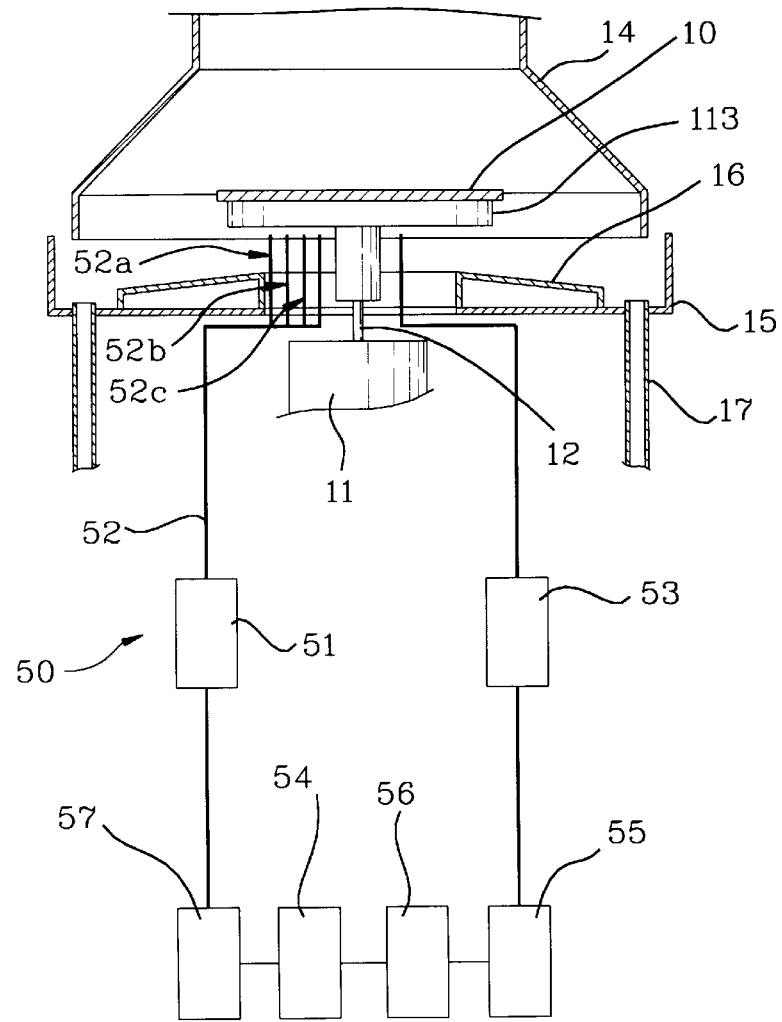
FIG. 5 shows a spinner having an infrared generator and non-contact thermometer as parts of a temperature controller in accordance with the present invention.

Referring to FIG. 5, in the wafer spinner of the present invention, a heating device and temperature sensor are added as a temperature controller assembly 50 to the conventional components. A modified rotation-plate vacuum chuck (rotation chuck) 113 is connected to a driving motor 11 through a rotation shaft 12 at the center of the spinner.

A bowl (upper cup) 14 is placed over the wafer, and a lower cup 15 is placed under the wafer. The cups 14 and 15 prevent cleaning water or photoresist from splashing out of the apparatus during processing. An inner cup 16 is placed under rotation chuck 113 and surrounds it, to prevent the photoresist from damaging the driving motor 11 placed in the bottom of the rotation chuck or damaging other parts of the fabrication apparatus. The surplus cleaning water and photoresist are guided by the inner cup 16, bowl 14 and lower cup 15, to drain through a drain outlet 17 placed below the lower cup 15.

Figure 4:
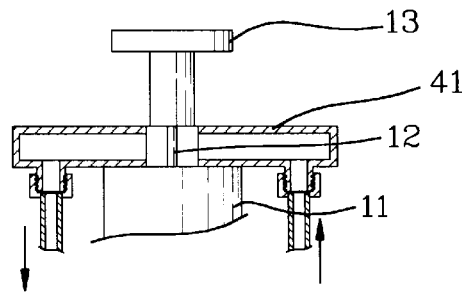
FIG. 4 is a cross-sectional view of a conventional spinner having a motor flange for cooling its driving motor.

In an embodiment of the present invention, as the rotation chuck 113 rotates it is heated under the control of a temperature controller to compensate for the effects of surface tension and heating by the driving motor 11 (including residual heating even when a motor flange 41 is used to cool the motor somewhat as shown in FIG. 4). The present invention creates a temperature distribution along the rotating chuck 113 that is transferred to the wafer 10 to reduce the variations of photoresist flow and therefore reduce variations in the resulting photoresist layer thickness. The predetermined temperature distribution depends on the kind of photoresist employed and photoresist coating process. In general, the temperature of the rotating chuck should be higher than the ambient temperature (i.e., 21° C. to 22° C.), or higher than the temperature of the photoresist supplied to the wafer, for example by 0° C. to 3° C. in the preferred embodiment.

In order to control the temperature of the rotation chuck 113, a plurality of points or locations may be heated on the rotation chuck 113. For example, three or four heating points are preferable to compensate for the heat generated from the driving motor 11 because the heat from the driving motor 11 is not evenly distributed throughout the wafer 10.

Figure 1:
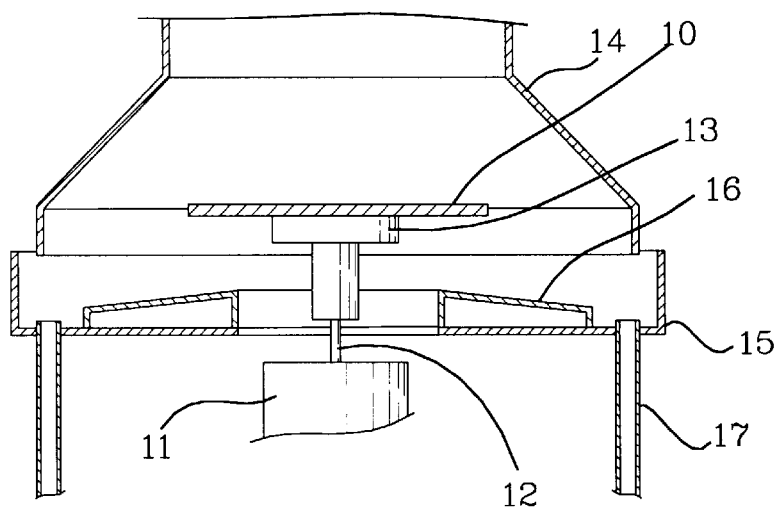
FIG. 1 is a schematic cross-sectional view of a conventional spinner.

The radius of the rotation chuck 13 (in FIG. 1) in the conventional spinner is less than one half of the radius of the wafer 10 it holds. In a preferred embodiment of the present invention, the radius of the rotation chuck 113 is greater than one-half the wafer radius, but less than the full wafer radius. This facilitates the control of the thickness of the photoresist layer on the wafer 10 by controlling the temperature on the rotating chuck 113.

Figure 2:
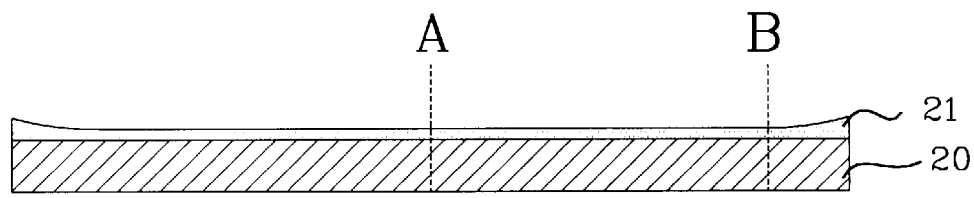
FIG. 2 is a cross-sectional view showing a wafer on which a photoresist is coated using a conventional spinner.
Figure 3:
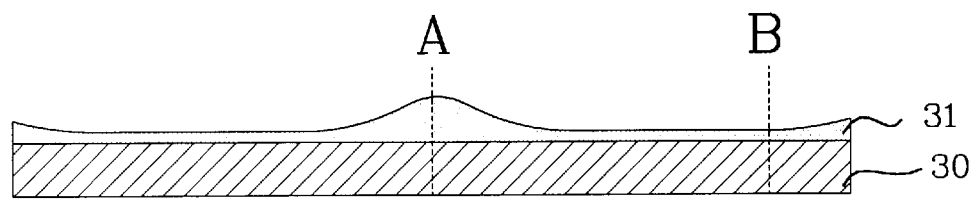
FIG. 3 is a cross-sectional view showing a wafer on which a photoresist is coated using a conventional spinner when its rotation shaft is heated by a motor.

Since the photoresist that is coated on the edge of the wafer 10 is thicker than other portions using the conventional spinner (see FIG. 2), in a preferred embodiment of the present invention, the edge of the wafer, namely, outside the flat zone, is not heated. Accordingly, the radius of the rotation chuck 113 in the present invention is less than the full wafer radius, and in the preferred embodiment is less than the flat-zone radius. This also reduces the chances that the photoresist will contact and damage the rotation chuck 113.

The transmission of the heat of the driving motor 11 through the rotation shaft 12 varies with the lapse of time. Accordingly, it is preferable that the amount of heat purposefully introduced to the heated points or locations on the rotation chuck 113 by the present invention be greater than the amount of heat generated from the driving motor 11. The heat purposefully introduced at the heating points on the rotating chuck 113 can be applied directly to the backside of the wafer 10. However, indirect heating through the rotation chuck 113 is preferable to prevent the wafer 10 from being thermally damaged at the point of heat introduction.

In the preferred embodiment, as shown in FIG. 5, the temperature controller assembly 50 includes an infrared generator 51, and an optical cable 52 for guiding the infrared radiation from the generator 51 to heat a specific portion of the rotation chuck 113. The temperature of the specific portion of the rotation chuck 113 can be controlled by adjusting the electric power source 57 of the infrared generator 51.

The temperature sensor, a non-contact thermometer 53, senses heat generated from a specific, localized portion of the rotation chuck 113 away from the center of the wafer, and converts the localized temperature sensed by the thermometer 53 into an electrical current signal. A non-contact sensor is used because it is more difficult to connect a fixed wire or communication line to the specific portion of the rotation chuck 113 because the rotation chuck is rotating. Accordingly, in the preferred embodiment, the temperature controller assembly 50, including the infrared generator 51 and non-contact thermometer 53, does not contact the rotation chuck 113. If the temperature controller were to come into contact with the rotation chuck 113, the friction due to the contact would increase the temperature in the spinner and may create contaminating particles, both of which have adverse effects on wafer quality.

The infrared generator power source 57 and non-contact thermometer 53 in this embodiment are connected to a heat regulator 56 through converters 54 and 55, respectively. The signal corresponding to the localized temperature measured by the thermometer 53 is sent to the heat regulator 56 through converter 55 via an electrical transmission line, and the heat regulator 56, responding to that signal, controls the power source 57 of the infrared generator 51. That is, the temperature controller assembly 50 has a feedback configuration consisting of the converter 55, the heat regulator 56, the other converter 54, and the power source 57.

In FIG. 5 one optical cable 52 may be connected from the infrared generator 51 to a point below the rotating chuck 113, or an additional plurality of optical cables 52a, 52b, 52c may be arranged to terminate in predetermined corresponding radial locations under the rotation chuck 113, so as to create a desired temperature distribution along the plurality of points.

Recall that the portion of photoresist deposited on the edge of wafer 10 is thicker than other portions in the conventional spinner due to the centrifugal force, even if the motor is cooled perfectly. In order to solve this problem, in the present invention the temperature is gradually decreased between the flat zone radius and the edge of the wafer. This can be accomplished either by the temperature controller assembly 50 and the distribution of temperatures resulting therefrom, or it can be accomplished by making the radius of the heated rotating chuck 113 less than the flat zone radius, or it can be accomplished using both methods in combination.

In addition to the method using the infrared generator 51 and optical cable 52 for the purpose of heating the rotation chuck 113, it is possible to use other electromagnetic waves as well. Alternatively, fine resistor lines can be arranged in the rotation chuck 113 to heat the rotation chuck 113. When the resistor lines are used, a brush should be provided on the rotation chuck 113 or shaft 12 to provide a connection between the resistor lines and the power source.

Therefore, using the present invention, it is possible to coat a photoresist more uniformly over the entire surface of a wafer during the fabrication of a semiconductor device. This reduces the number of malfunctioning devices resulting from the fabrication process.

While the present invention has been particularly shown and described as the preferred embodiments above, those skilled in the art should understand that various modifications and variations can be made in the spinner for fabricating a semiconductor device of the present invention without departing from the spirit or scope of the invention as defined by the appended claims and their equivalents.

Having thus described our invention, what we claim as new and desire to secure by Letters Patent is as follows:

1. A wafer spinner which distributes photoresist on a wafer in a semiconductor device fabrication apparatus, the wafer spinner comprising:

a rotation-plate vacuum chuck for holding a wafer;

a driving motor which rotates the chuck;

a non-contact variable heat source for heating the chuck on at least one heating location on the chuck spaced from a center of the chuck, the non-contact variable heat source being spaced from the chuck and comprising an infrared generator for emitting infrared radiation, and an optical cable for guiding the infrared radiation to the chuck to said at least one heating location;

a temperature sensor which senses at least one localized temperature of the chuck at a sensing location on the chuck spaced from the center of the chuck and produces a signal proportional to the localized temperature; and a temperature regulator which receives the signal from the temperature sensor and controls the non-contact variable heat source in accordance with the signal to maintain the temperature at the predetermined portion within a predetermined localized temperature range.

2. The spinner of claim 1, further comprising a plurality of temperature sensors which sense temperatures at corresponding portions of the chuck and the temperature regulator adjusts a temperature of each corresponding portion of the chuck in accordance with a sensed temperature at that portion to maintain a predetermined temperature-distribution range across the chuck.

3. The spinner of claim 1, wherein the chuck has a radius that is greater than one-half a wafer radius and less than the wafer radius.

4. The spinner of claim 1, the non-contact variable heat source further comprising a plurality of optical cables positioned at a plurality of corresponding radii of the chuck.

5. The spinner of claim 1, the temperature sensor comprising a non-contact thermometer spaced from the chuck.

6. The spinner of claim 1, wherein the temperature regulator controls the infrared generator to emit infrared radiation at a level proportional to the temperature sensed by the temperature sensor.

7. The spinner of claim 4, wherein different heating elements provide different heating levels in accordance with a predetermined temperature distribution across the chuck.

8. The spinner of claim 4, wherein a maximum radius of the plurality of corresponding radii is less than a flat zone radius.

9. The spinner of claim 1, wherein the predetermined temperature is a temperature of the photoresist supplied to the wafer.

10. The spinner of claim 1, wherein the predetermined temperature is an ambient temperature.

11. The spinner of claim 1, wherein the temperature regulator further maintains the temperature at the predetermined portion at less than or equal to the predetermined temperature plus a predetermined variation.

* * * * *